United States Patent [19]
Ho

[11] Patent Number: 5,940,020
[45] Date of Patent: Aug. 17, 1999

[54] DIGITAL TO ANALOG CONVERTER WITH A REDUCED RESISTOR COUNT

[75] Inventor: Kah Leong Ho, Singapore, Singapore

[73] Assignee: Tritech Microelectronics, Ltd, Singapore, Singapore

[21] Appl. No.: 08/947,883

[22] Filed: Oct. 9, 1997

[51] Int. Cl.[6] ............................................... H03M 1/66
[52] U.S. Cl. ......................................................... 341/145
[58] Field of Search ................................. 341/145, 156, 341/154, 159, 118

[56] References Cited

U.S. PATENT DOCUMENTS

| | | | |
|---|---|---|---|
| 4,918,448 | 4/1990 | Hauriller et al. | 341/145 |
| 5,111,205 | 5/1992 | Morlon | 341/156 |
| 5,252,975 | 10/1993 | Yuasa et al. | 341/145 |
| 5,495,245 | 2/1996 | Ashe | 341/145 |
| 5,554,986 | 9/1996 | Neidorff | 341/145 |

*Primary Examiner*—Brian Young
*Attorney, Agent, or Firm*—George O. Saile; Stephen B. Ackerman

[57] ABSTRACT

This invention describes a DAC requiring a substantially lower number of resistors for conversion of n+p digital bits. The conversion to an analog signal is done in two voltage dividers. The first voltage divider contains $2^n$ resistors and is referenced to a voltage bias. The second voltage divider contains $2^p$ resistors and is referenced to a current bias. The current bias is derived from a current mirror which references the current in the first voltage divider. The use of the current mirror allows all resistors in the DAC to be of the same value which in turn provides an implementation with better accuracy and resistor matching. The number of resistors required to make a conversion of a 12 bit digital signal is 272 where 8 bits are converted in the first voltage divider and 4 bits are converted in the second voltage divider.

19 Claims, 5 Drawing Sheets

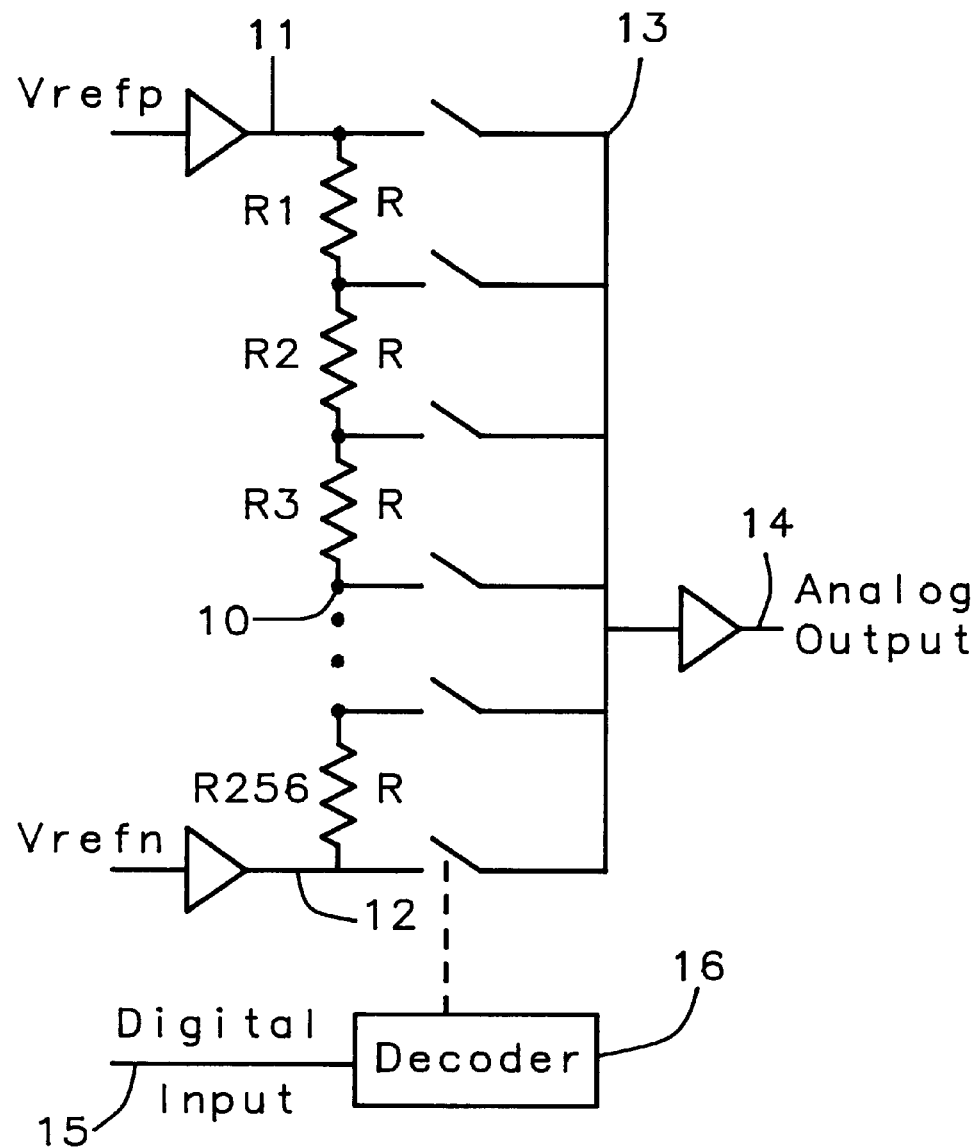
FIG. 1a - Prior Art

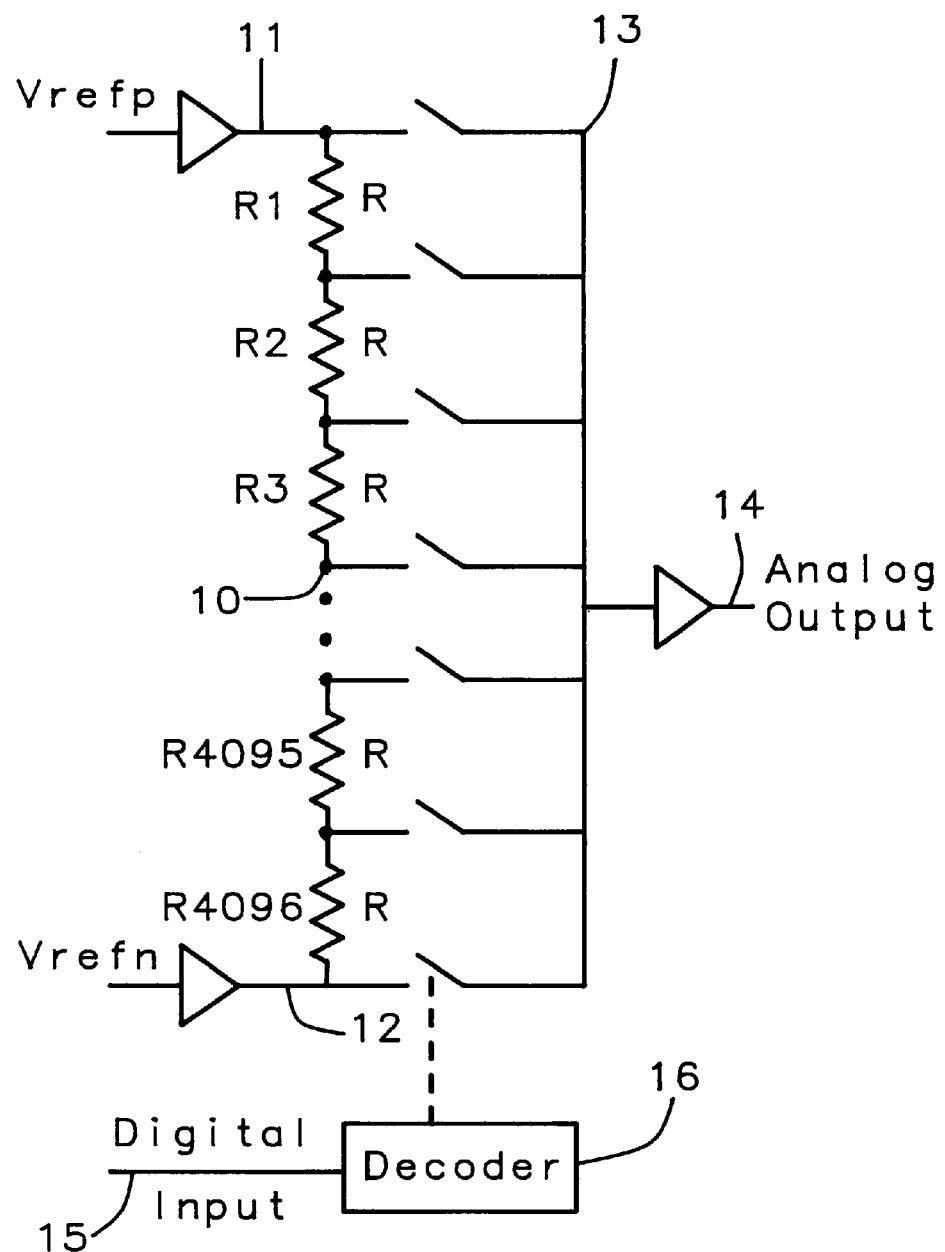
FIG. 1b - Prior Art

DIGITAL TO ANALOG CONVERTER WITH A REDUCED RESISTOR COUNT

BACKGROUND OF THE INVENTION

1. Field of Invention

This invention is relates to digital to analog converters (DAC's) and in particular resistor voltage divider DAC's.

2. Description of Related Art

Conventional resistor DAC's require $2^n$ resistors to implement an "n" bit resolution. Thus an eight bit DAC would require 256 resistors, a ten bit DAC 1024 resistors and a twelve bit DAC 4096 resistors. It is easy to see that there is a need to reduce the number of resistors, especially in higher resolution DAC's. In U.S. Pat. No. 4,918,448 (Hauviller et al.) a multistage DAC is described with an extension to provide higher resolution. This design requires $2^n$ resistors plus $2^{p-2}$ resistors for the extension and provides monotonicity of conversion unimpaired by the extension to "p" additional bits. In U.S. Pat. No. 5,252,975 (Yuasa et al.) is described a resistor DAC having multiple networks and the objective to not have buffer amplifiers interconnecting the various networks. In U.S. Pat. No. 5,495,245 (Ashe) a potentiometer like DAC is described in which there are three resistor divider networks used, two for the most significant bits (MSB) and one for the least significant bits (LSB). The total number of resistors required is $2^{n/2}-1$ for each MSB resistor divider network and $2^{n/2}$ resistors for the LSB resistor divider network. The resistor values in the LSB network are $R/2^{n/2}$ where "R" is the value of the resistors in the MSB networks. In U.S. Pat. No. 5,554,986 (Neidorff) is described a multi-stage resistor DAC designed to produce enhanced accuracy at an increased speed. Each stage converting a portion of the input digital word and the resistors of each subsequent stage having a higher resistor value to reduce loading on the previous stage.

Extending the resolution of a resistor DAC can require a substantial increase in the number of resistors to provide the increased resolution. This is particularly true if the increased resolution is obtained in the straight forward way by adding additional resistors. Various means exist for increasing the resolution of a DAC, but these usually require that the resistors that make up the voltage dividers are not of the same value. This can impair the optimal choice of the value for all of the resistors with respect to accuracy and tolerance of the resistor value. It is important to greatly reduce the number of resistors required to convert a digital word with n+p bits to an analog signal and at the same time have multiple sections of resistors with the value of each resistor in each section being the same.

SUMMARY OF THE INVENTION

This invention consists of a DAC with two resistor voltage divider networks, each containing resistors of value "R". The first of these voltage dividers is used to convert the high order bits of an input digital word into an analog signal. The second of the voltage divider is used to convert the low order bits of the input digital signal into an analog signal and combine it with analog signal from the conversion of the high order bits from the first voltage divider to produce an output of the DAC.

The first voltage divider is a set of $2^n$ resistors connected in series between voltages Vrefp on the high end and Vrefn on the low end, where "n" is the number of high order bits in the input digital word. This creates a voltage step $V1=(Vrep-Vrefn)/2^n$ across each resistor in the first voltage divider. Vrefn is a bias offset voltage upon which the results of the digital to analog conversion sits. A set of switches is connected to the first voltage divider to select an analog voltage, $V1out=Vrefn+A\cdot V1$, that represents the high order bits of the input digital word, where "A" is an integer from 0 to $2^n-1$. The selection of these switches is controlled by the input digital signal through a digital decoder. The analog output voltage of the first voltage divider, V1out 33, is connected through a buffer amplifier to the low end of the second voltage divider of $2^p$ resistors, where "p" is the number of low order bits in the input digital word. Connected to the upper end of the second voltage divider is a current mirror. The current mirror is referenced to the current flowing through the resistors of the first voltage divider and has a value $Ib=Ia/2^p$ where $Ia=(Vrefp-Vrefn)/R\cdot 2^n$ is the current flowing in the resistors of the first voltage divider and "p" is the number of lower order bits of the input digital word. The voltage step in the second voltage divider is $V2=(Ia/2^p)\cdot R$. A second set of switches, controlled by the lower order bits of the input digital word is connected the second voltage divider. The output voltage, $Vout=Vrefn+A\cdot V1+B\cdot V2$, selected by the second set of switches is connected to output of the DAC through a buffer amplifier, where "B" is an integer from 0 to $2^p-1$. As can be seen from the equation for Vout, the voltage selected by the second set of switches is a combination of the conversion of the high order bits, $A\cdot V1$, and the conversion of the low order bits, $B\cdot V2$.

The total number of resistors required is $2^n+2^p$, where n+p is the total number of bits in the input digital word. If the high order bits converted by the first voltage divider are 8, then a 10 bit digital word requires 260 resistors and a 12 bit digital word requires 272 resistors. This compares favorably with conventional resistor DAC which require 1024 resistors for a 10 bit DAC and 4096 for a 12 bit DAC. In addition, all the resistors are of equal value and can be implemented in a semiconductor chip as resistor segments of the same size for better matching and accuracy.

BRIEF DESCRIPTION OF THE DRAWINGS

This invention will be described with reference to the accompanying drawings, wherein:

FIG. 1a is a schematic diagram of a conventional eight bit resistor DAC;

FIG. 1b is a schematic diagram of a conventional twelve bit resistor DAC;

DETAILED DESCRIPTION OF THE PREFERRED EMBODIMENT

Figure 2:
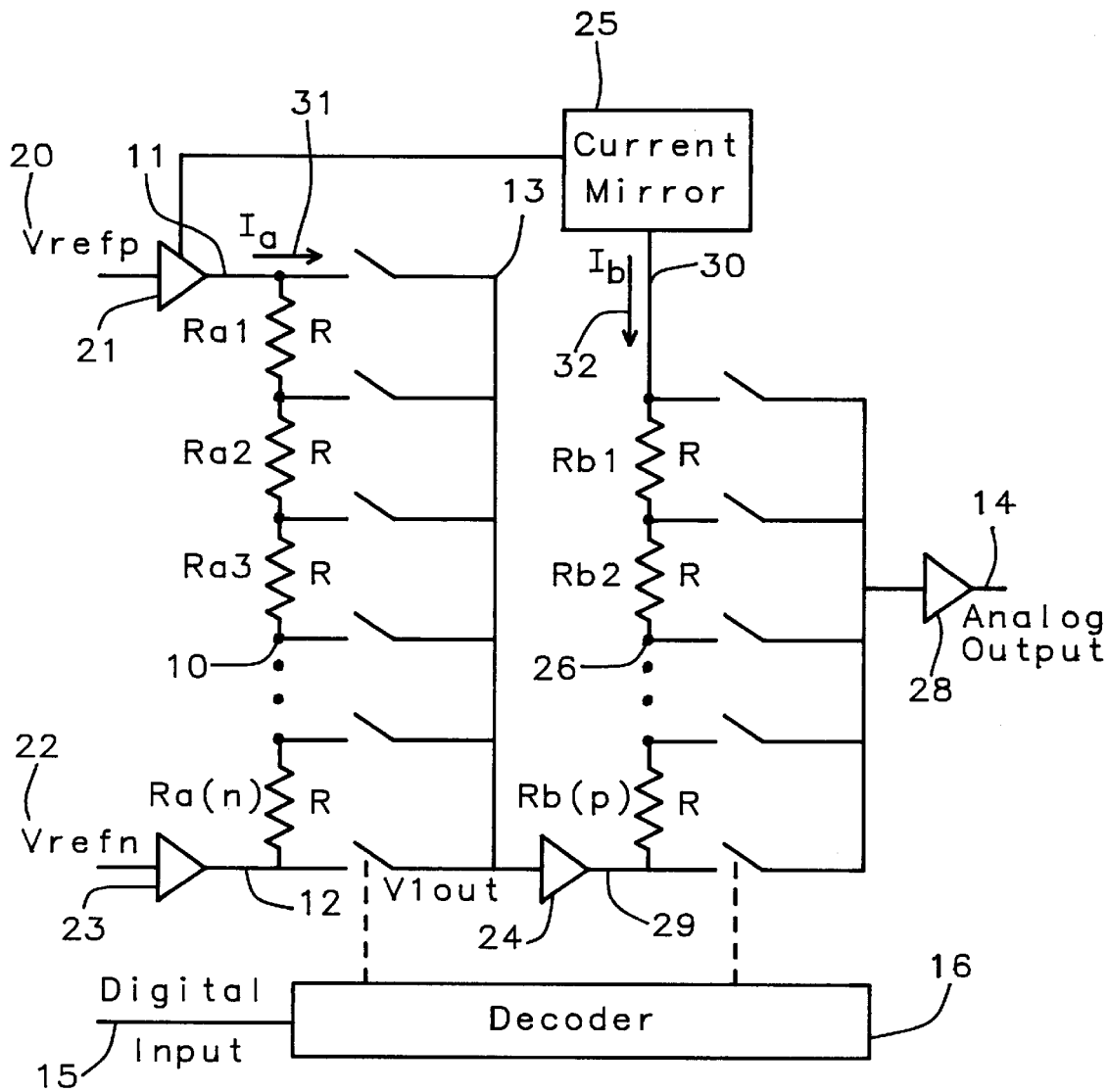
FIG. 2 is a schematic diagram of a DAC of this invention.

Shown in FIG. 1a is a conventional eight bit DAC. A two hundred fifty six resistor voltage divider 10 is connected between buffered voltages 11 12. A set of switches 13, controlled by a digital input 15 through a decoder 16, select a voltage from the voltage divider 10 and connects the selected voltage to a buffered analog output 14. Increasing the resolution of the conventional DAC from eight to twelve bits increases the number of resistors in the voltage divider 10 to four thousand ninety six as shown in FIG. 1b. The number of switches 13 also substantially increased from two hundred fifty seven to four thousand ninety seven as the resolution of the DAC is increased from eight bits to twelve.

Referring to FIG. 2, a schematic diagram of the resistive DAC of the invention is shown having a first section 10 13 to convert the "n" high order bits of a digital input signal 15 and a second section 26 27 to convert the "p" low order bits. A reference voltage Vrefp 20 is connected to the upper end 11 of a first resistor voltage divider 10 by means of a buffer amplifier 21. A second reference voltage Vrefn 22 is connected to the lower end 12 of the first voltage divider 10 by means of a buffer amplifier 23. Each resistor in the first voltage divider 10 has the same value "R". Connected to one end of each resistor in the voltage divider 10 is a switch that is a part of a first set of switches 13. The activation of these switches 13 is controlled by the decoder 16 to which is connected the digital input 15.

Continuing to refer to FIG. 2, a particular digital value of the high order bits of the digital input signal 15 selects a switch in the first set of switches 13 and connects a voltage equivalent to the high order bits to the second section 26 27 of the DAC through a buffer amplifier 24. The voltage representing the high order bits connected from the buffer amplifier 24 to the lower end 29 of the second voltage divider 26. The upper end 30 of the second voltage divider 26 is connected to a current mirror 25. The resistors that make up the second voltage divider 26 are the same value "R" as the resistors in the first voltage divider 10. The current mirror 25 provides a current bias to the second voltage divider 26 and is referenced from the current Ia 31 which flows through the first voltage divider 10. The current Ib 32 is equal to magnitude of the current Ia 31 scaled down by two raised a power equal to the number of bits "p" associated with the second voltage divider 26, $Ib=Ia/2^p$. This division provides a proper scaling for the voltage drop across each resistor in the second voltage divider 26.

Continuing to refer to FIG. 2, a second set of switches 27 controlled by the decoder 16 is connected to the second voltage divider 26. The switches forming the second set of switches 27 connect to one end of each resistor in the second voltage divider 26. The decoder 16 selects a switch in the second set of switches 27 corresponding to the low order bits of the digital input signal 15, and connects a voltage from the second voltage divider 26 which corresponds to the sum of the value of the low and high order bits of the digital input signal 15 to the analog output 14 through a buffer amplifier 28. The voltage connected to the analog output 14 carries with it the voltage output of the first voltage divider 10 representing the high order bits and Vrefn 22 since these voltages form a base for the voltage selected from the second voltage divider 26.

The voltage at the analog output 14 in FIG. 2 is Vout= Vrefn+A·V1+B·V2, where V1 is the voltage step across each resistor in the first voltage divider 10, V2 is the voltage step across each resistor in the second voltage divider 26, A is an integer representing the numerical value of the high order bits of the input signal 15, and B is an integer representing the numerical value of the low order bits of the input signal 15. The total number of resistors required for the two voltage dividers 10 26 is $2^n+2^p$, where n is the number of bits of the digital input 15 converted to an analog signal in the first voltage divider 10 and "p" is the number of bits of the digital input 15 converted to an analog signal in the second voltage divider 26. Thus for a 12 bit DAC, where "in" is eight and "p" is four, only two hundred seventy two resistors are required. This is a considerable reduction in the number of resistors compared to the conventional 12 bit DAC shown in FIG. 1b.

Figure 3:
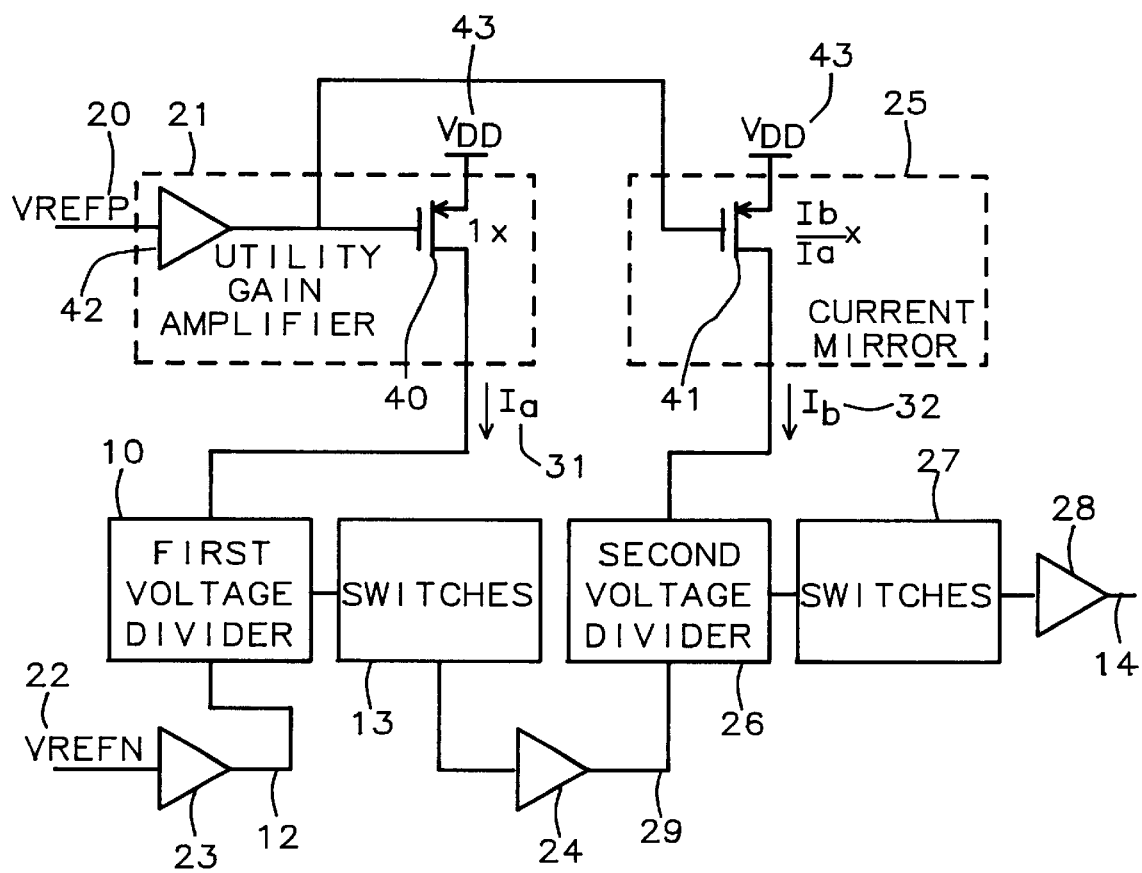
FIG. 3 is a schematic diagram of the current mirror interconnections.

In FIG. 3 is shown the connection of the current mirror 25 to the unity gain amplifier 21. The unity gain amplifier 21 has a first stage 42 connected to an output transistor 40. A voltage reference Vrefp 20 is connected to the input of the first stage 42 of the unity gain amplifier 21. The output transistor 40 is connected between voltage bias VDD 43 and first voltage divider 10 of the DAC. The first stage 42 of the unity gain amplifier 21 in conjunction with the output transistor 40 provides a voltage bias to the first voltage divider 10 as determined by Vrefp 20. A current Ia 31 flows through the first voltage divider 10 as determined by the reference voltages Vrefp 20 and Vrefn 22 and the resistance of the first voltage divider 10. The current Ia 31 flows through the output transistor 40 of the unity gain amplifier 21. The width to length ratio of the unity gain amplifier output transistor 40 is designed to permit Ia 31 to flow through the output transistor 40.

Continuing to refer to FIG. 3, the current mirror 25 is a transistor 41 connected between voltage bias VDD 43 and the second voltage divider 26 of the DAC. The current mirror transistor 41 provides a current bias Ib 32 to the second voltage divider 26. The gate of the current mirror transistor 41 is connected to the output of the first stage 42 of the unity gain amplifier 21 and receives the same input voltage as the gate of the unity gain amplifier output transistor 40. The unity gain amplifier output transistor 40 is the reference transistor for the current mirror 25. Since the gate of the current mirror transistor 41 and the gate of the reference transistor 40 receive the same input, the current flowing through the two transistors 40 41 is determined by the length to width ratios of the channels of each transistor. Given that Ia 31 flows through the unity gain amplifier output transistor 40 which has a length to width ratio of "1x", then to produce Ib 32 the length to width ratio of the channel of the current mirror transistor must be (Ib/Ia)x.

Continuing to refer to FIG. 3, the current mirror transistor 41 has the same gate voltage as that of the unity gain amplifier output transistor 40, but depending on the W/L ratio, a different amount of current Ib 32 will flow in the current mirror transistor 41. In a semiconductor process where the channel is defined by a polysilicon shape appearing as a set of finger like elements, the W/L ratio can be easily and accurately defined by the number of "fingers" that make up the transistor channel where the number of fingers define the channel width (W) and the length of a finger defines the length (L). The current Ib 32, flowing through the second voltage divider, is a reciprocal multiple of the current flowing in the unity gain amplifier output transistor 40 through the first voltage divider. The current Ib 32 flowing in the second voltage divider 26 establishes a voltage step in the second voltage divider 26 that corresponds to the resolution of the DAC. For example, an output current Ib 32 that is one eighth of the reference current Ia 31 would be accomplished with a one polysilicon finger channel in the current mirror transistor 41 with eight polysilicon fingers defining the channel of the reference transistor 40. If the output current Ib 32 in the current mirror transistor 41 is to be one sixteenth of the current in the unity gain amplifier output transistor 40, then the current mirror transistor 41 would have a one polysilicon finger channel and the unity gain amplifier output transistor 40 would have a sixteen polysilicon finger channel. Other ratios of polysilicon fingers can be used such as two thirds and one fifth. The importance of defining currents Ia 31 and Ib 32 in whole units of polysilicon fingers is to allow an implementation in silicon where the ratio of current between Ia 31 and Ib 32 is maintained as accurately as possible.

Continuing to refer to FIG. 3, the first voltage divider 10 divides the voltage in equal increments between Vrefp 20 and Vrefn 22. A set of switches 13 are used to select a voltage from the first voltage divider 10 that corresponds to the high order bits of the digital input signal 15 shown in FIG. 2. This selected voltage is offset from circuit ground by Vrefn 22 and is connected to the second voltage divider 26 through a buffer amplifier 24. The voltage step in the second voltage divider 26 is established by Ib 32 flowing through a number of resistors of equal value and having the same value as the resistors in the first voltage divider 10. A set of switches 27 are selected by the low order bits of the digital input signal 15, shown in FIG. 2, to provide an output voltage that is the sum of Vrefn 22, a voltage equivalent to the high order bits, and a voltage that is equivalent to the low order bits. This output voltage is connected to the output of the DAC 14 through a buffer amplifier 28.

Figure 4:
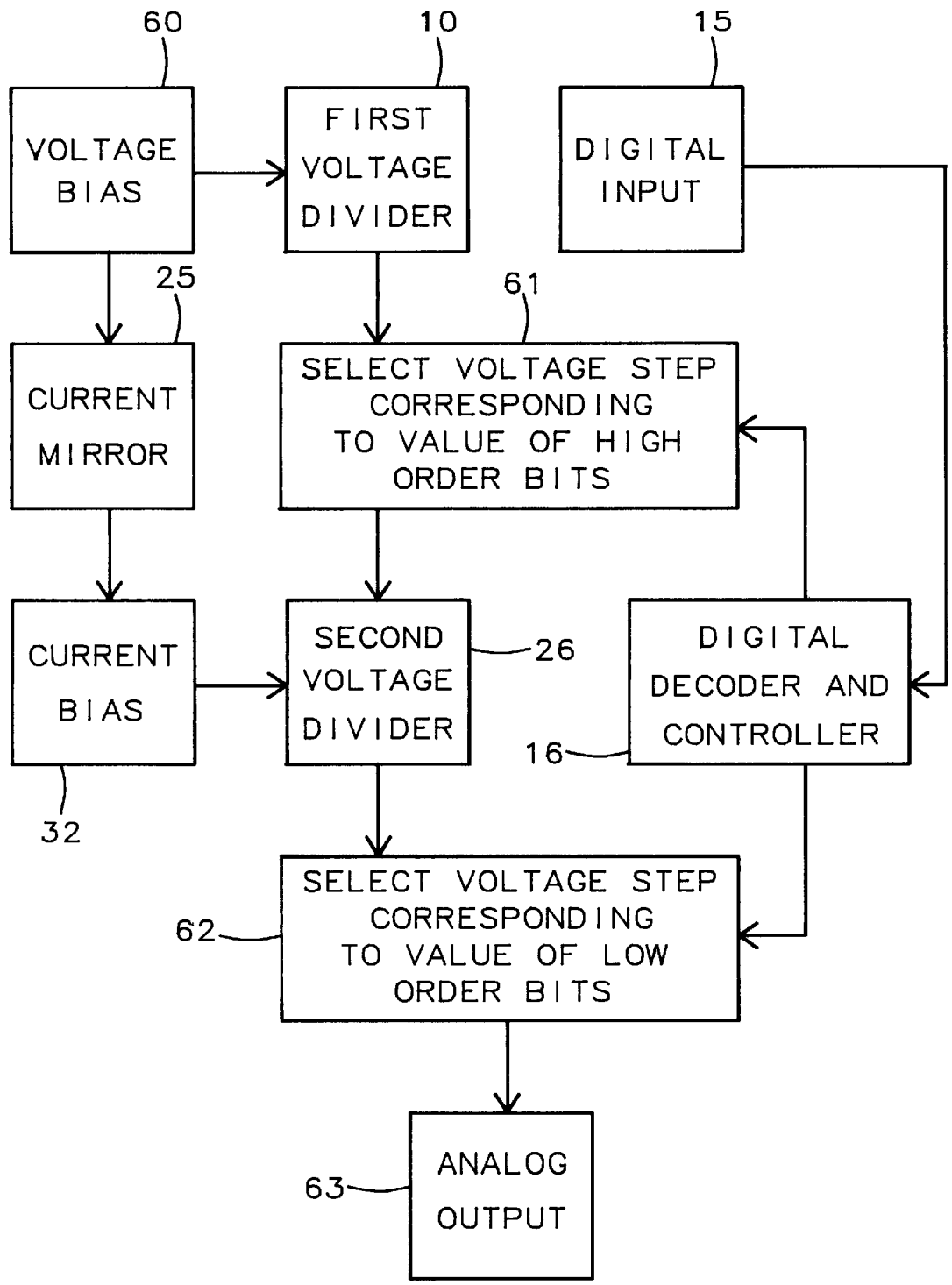
FIG. 4 is diagram showing the process of digital to analog conversion.

In FIG. 4 is shown the method which the digital to analog conversion takes place. A voltage bias 60 is applied to a first voltage divider 10. A voltage step formed by the voltage divider 10 and corresponding to the high order bits 61 is selected from the first voltage divider 10. This voltage step selection corresponding to the high order bits 61 is controlled by the high order bits of the digital input signal 15 connected through a digital decoder 16. The selected voltage 61 is applied to the second voltage divider 26 as a voltage bias. A current bias 32 resulting from a current mirror 25, which references the current flowing in the first voltage divider 10, is applied as a bias to the second voltage divider 26. The current bias 32 is proportional to the current flowing in the first voltage divider 10 and establishes a voltage step in the second voltage divider 26 which is the resolution of the digital to analog conversion. Next a voltage step corresponding to the value of the low order bits is selected 62 in the second voltage divider 26. The selection is controlled by the low order bits of the digital input signal 15 connected through the digital decoder 16 and forms the analog output 63. The analog output 63 is a voltage that is a composite sum of the selected voltage corresponding to the value of the high order bits 61 and the selected voltage corresponding to the value of the low order bits 62.

Thus this invention describes an digital to analog converter which reduced the number of resistors required in the voltage dividers 10 26. Further the resistors that make up the voltage dividers 10 26 are of equal value thereby providing better silicon implementation and matching. The use of a current mirror 25 to produce a current bias Ib 32 in the second voltage divider 26 in combination with the same value resistors allows transistors 40 41 to be formed with multiples of whole polysilicon fingers defining the respective channels for accurate semiconductor processing and control of the current flowing relative to each transistor 40 41.

While the invention has been particularly shown and described with reference to preferred embodiments thereof, it will be understood by those skilled in the art that various changes in form and details may be made without departing from the spirit and scope of the invention.

What is claimed is:

1. A digital to analog converter, comprising:
   a) a first voltage divider biased by means of a voltage source,
   b) a second voltage divider biased by means of a current mirror connected to a first end of said second voltage divider,
   c) a selected voltage from said first voltage divider connected to a second end of said second voltage divider by means of a first set of switches,
   d) said current mirror producing a current in the second voltage divider proportional to a reciprocal multiple of current flowing in the first voltage divider,
   e) said current in the second voltage divider producing a voltage step corresponding to resolution of the digital to analog converter,
   f) an analog output voltage selected by a second set of switches connected to the second voltage divider,
   g) a digital input signal controlling the selection of switches in the first and second set of switches.

2. The digital to analog converter of claim 1, wherein each resistor in the first voltage divider and the second voltage divider are the same value providing for better resistor matching and tracking in a semiconductor implementation.

3. The digital to analog converter of claim 1, wherein the current mirror produces said current in the second voltage divider that is the reciprocal multiple of the current flowing in the first voltage divider to provide a more accurate semiconductor implementation, comprising:
   a) the current flowing in the first voltage divider determined by W/L (width/length) ratio of a reference transistor of the current mirror,
   b) the W/L ratio of the reference transistor established by a polysilicon shape resembling fingers,
   c) a number of polysilicon fingers used to define the reference transistor,
   d) a reciprocal multiple of the number of polysilicon fingers of the reference transistor used to define output transistor of the current mirror,
   e) a W/L size of the output transistor of the current mirror producing a current proportional current flowing through the reference transistor and creates a voltage step in the second voltage divider at the resolution of the digital to analog converter.

4. A method for converting a digital signal to an analog voltage, comprising:
   a) selecting a voltage from a first voltage divider,
   b) connecting said voltage from first voltage divider to a second voltage divider,
   c) further connecting a current bias proportional to a reciprocal multiple of current in the first voltage divider to said second voltage divider,
   d) selecting a voltage from said second voltage divider corresponding to an input digital signal.

5. The method of claim 4, wherein selecting the voltage from the first voltage divider is controlled by high order bits of the input digital signal.

6. The method of claim 4, wherein selecting the voltage from the second voltage divider is controlled by low order bits of the input digital signal.

7. The method of claim 4, wherein connecting the current bias to said second voltage divider proportional to current in first current divider is by means of a current mirror.

8. A resistor DAC, comprising:
   a) a first voltage divider having a number of resistors connected in series between circuit reference voltages,
   b) a second voltage divider having a number of resistors connected between a current mirror and output of the first voltage divider,
   c) said current mirror producing current proportional to a reciprocal multiple of current flowing in the first voltage divider,
   d) a first set of switches selecting an output voltage of the first voltage divider, e) the output voltage of the first voltage divider being proportional to high order bits of a digital input signal, f) a second set of switches selecting an output voltage of the second voltage divider, g) the output voltage of the second voltage divider being proportional to a sum of the high and low order bits of a digital input signal and any bias offset voltage.

9. The resistor DAC of claim 8, wherein a minimum number of resistors are required for the first and second voltage dividers, comprising:

a) a digital input signal consisting of "n" high order bits and "p" low order bits where n+p is the total number of bits in the digital input signal, b) the first voltage divider containing $2^n$ resistors, c) the second voltage divider containing $2^p$ resistors.

10. The resistor DAC of claim 8, wherein the resistors in the first and second voltage divider are of the same value.

11. The resistor DAC of claim 8, wherein a voltage step of the first voltage divider is a function of the number of resistors in the first voltage divider and a voltage step in the second voltage divider corresponding to the resolution of the resistor DAC is a function of the current mirror referenced from current in the first voltage divider.

12. The resistor DAC of claim 11, wherein the current mirror is $I_{ref}/2^p$ where $I_{ref}$ is the current in the first voltage divider and "p" is a count of low order bits.

13. A resistor DAC with a current mirror bias, comprising:

a) a first section for converting "n" high order bits of an input digital signal, b) a second section for converting "p" low order bits of the input digital signal, c) said first section comprising a resistor voltage divider between reference voltages and a first set of switches controlled by the input digital signal through a digital decoder, d) said first set of switches selecting an output voltage of the first section, e) the output of the first section connected to said second section through a buffer, f) said second section comprising a resister voltage divider connected between a current mirror and output of the first section, g) a second set of switches controlled by the input digital signal through the digital decoder and selecting an output voltage of the second section, h) said current mirror producing a reciprocal multiple of the current flowing in the first section, i) the output of the second section being proportional to sum of the high and low order bits of the input digital signal and any bias offset voltage.

14. The resistor DAC of claim 13, wherein resistor values in the first section and the second section are of same value.

15. The resistor DAC of claim 13, wherein a total number of resistors is $2^n+2^p$.

16. A digital to analog converter, comprising:

a) a digital input and an analog output, b) a first voltage divider connected between two reference voltages, c) said first voltage divider connected to the second voltage divider by means of a first set of switches, d) said second voltage divider biased by means of a current mirror, e) said current mirror producing a current in said second voltage divider that is a reciprocal multiple of current flowing in the first voltage divider, f) said second voltage divider connected to the analog output by means of a second set of switches, g) said digital input selecting by means of a decoder a first switch within the first set of switches to connect a first voltage of the first voltage divider to the second voltage divider, h) said digital input selecting by means of the decoder a second switch within the second set of switches to connect a second voltage of the second voltage divider to the analog output, i) said second voltage being an analog equivalent of a digital input signal.

17. The digital to analog converter of claim 16, wherein buffer amplifiers isolate the first and the second voltage dividers, comprising:

a) a first reference voltage connected to the first voltage divider through a first buffer amplifier, b) a second reference voltage connected to the first voltage divider through a second buffer amplifier, d) the first voltage divider connected to the second voltage divider through a third buffer amplifier, c) the second voltage divider connected to the analog output through a fourth buffer amplifier.

18. The digital to analog converter of claim 16, wherein individual resistors in the first voltage divider and the second voltage divider are the same value.

19. The digital to analog converter of claim 16, wherein a combined number of resistors in the first voltage divider and the second voltage divider is $2^n+2^p$, where "n" is a number of digital bits converted in the first voltage divider and "p" is a number of bits converted in the second voltage divider.

* * * * *